United States Patent [19]

Hartemann

[11] Patent Number: 5,043,580
[45] Date of Patent: Aug. 27, 1991

[54] RADIATION DETECTOR

[75] Inventor: Pierre Hartemann, Paris, France

[73] Assignee: Thomson-CSF, Puteaux, France

[21] Appl. No.: 463,318

[22] Filed: Jan. 10, 1990

[30] Foreign Application Priority Data

Jan. 13, 1989 [FR] France ................ 89 00373

[51] Int. Cl.$^5$ ............................................ H01L 39/00
[52] U.S. Cl. ................................ 250/336.2; 505/848; 505/849
[58] Field of Search .............. 250/336.2; 505/848, 505/849

[56] References Cited

U.S. PATENT DOCUMENTS

| 2,932,743 | 4/1968 | Atwood . | |
|---|---|---|---|
| 3,077,538 | 8/1970 | Franzen . | |
| 3,691,381 | 9/1972 | Kleppner | 250/336.2 |
| 3,906,231 | 9/1975 | Fletchner et al. | 250/336.2 |
| 4,853,538 | 8/1989 | Jackson | 250/336.2 |
| 4,935,626 | 6/1990 | Schneider | 250/336.2 |

FOREIGN PATENT DOCUMENTS 85491 4/1940 France .

OTHER PUBLICATIONS

Kurakado, Mashako, "Radiation Using Super Conductive Tunnel Junction & Light Incident Position Detector", Dec. 1, 1986, ABS.
Japanese Journal of Applied Physics (Part 2), vol. 26, Supplement 26-3, 1987 pp. 1145-1146, Tokyo, JP; Y. Enomoto et al.: "Far Infrared Detector Using Boundary Josephson Junctions" pp. 1145-1146; FIG. 1*.
Instruments and Experimental Techniques, vol. 27, No. 4, Partie 1, Juillet-aout 1984, pp. 781-804, Plenum Publishing Corp., New York, US; I. A. Khrebtov: "Superconducting Bolometers (Review)".

Primary Examiner—Carolyn E. Fields
Assistant Examiner—Drew A. Dunn
Attorney, Agent, or Firm—Oblon, Spivak, McClelland, Maier & Neustadt

[57] ABSTRACT

A radiation detector comprising an element made of superconductive material supplied by an electrical generator as well as a system to measure the resistance of the element. For example, the generator is a constant voltage source. The measuring system utilizes a resistor placed in series with the superconductive element and a voltage measuring apparatus connected to the terminals of the resistor. Incident radiation has the effect of causing variations in the resistance of the superconductive element. Consequently, from the value of the resistance of the superconductive element, the intensity of the radiation received is detected. The disclosed device can be applied to the detection of radiation located between the visible wavelengths and the dwarf wavelengths.

16 Claims, 5 Drawing Sheets a)

b)

RADIATION DETECTOR

BACKGROUND OF THE INVENTION

An object of the invention is a radiation detector, notably a radiation detector wherein the sensitive element is made of superconductive material.

More particularly, the invention concerns configurations of sets of sensitive elements made of superconductive materials with a grain structure by which it is possible to obtain images in incoherent radiation, with a wavelength in the range between the visible wavelengths and the dwarf wavelengths.

The superconductive material may have a high critical temperature and may be used notably in a temperature range extending from 77 K (liquid nitrogen) to 27 K (liquid neon).

A planar element made of a granular superconductor 1, as shown in FIG. 1, having a current I flowing through it and being illuminated by a radiation spot with a wavelength between a visible wavelength and a dwarf wavelength undergoes local change in its resistance.

The interaction between the superconductor and the incident radiation takes place according to two physical processes depending on whether the wavelength is smaller than about some tens of micrometers or whether the wavelength is greater than some tens of micrometers.

If the wavelength of the radiation illuminating the superconductive material 1 of FIG. 1 is smaller than some tens of micrometers, then the energy of the photons is sufficient to break the Cooper pairs into quasi-particles that spread in the grains and get recombined. Two types of phenomena can be observed:

a) The populations of Cooper pairs and quasi-particles are in a state of equilibrium: the radiation heats the superconductive element (bolometrical effect represented by the zone "a" of the curve $\Delta V$ as a function of the temperature of FIG. 2). The width of the forbidden band of the superconductor diminishes when the temperature increases.

b) The populations of pairs and of quasi-particles are in a state of disequilibrium. The width of the forbidden band is reduced by a value proportionate to the excess of quasi-particles (zone "b" of the curve $\Delta V$ as a function of the temperature of FIG. 2).

In a granular superconductor, the grain boundaries constitute barriers of Josephson junctions. When the width of the forbidden band is reduced, the density of the critical current of the grain boundaries is reduced and becomes smaller than the density of current given. Under these conditions, the magnetic field penetrates the vortex-shaped grain spaces which move under the effect of the Lorentz force in dissipating power. A radiation thus induces a photoresistance in the illuminated zone and the amplitude of the response is proportionate to the number of moving vortices. FIG. 2 shows, by way of an example, the response as a function of the temperature. The types of response "a" and "b" are clearly distinguished.

If the wavelength of the radiation illuminating the superconductive material 1 is greater than a few tens of micrometers, the energy of the photons is smaller than the width of the forbidden band. However, the currents compensating for the magnetic field are greater than the critical currents of the grain boundaries and the magnetic field penetrates the boundaries in the form of vortices that move in dissipating power.

The invention applies this phenomenon of induction of a photoresistivity in a superconductive material, under the effect of an illumination by radiation.

An elementary detector such as this has the advantage, as compared with known photoconductor detectors, of enabling the making of sensitive detection elements having smaller dimensions. For, in the devices according to the invention, the sensitive part is restricted to the part illuminated by the radiation beam to be detected whereas, in photoconductors, there is a spreading of the sensitive zone as compared with the illuminated zone as shall be seen further below.

Furthermore, certain embodiments of the invention enable operation without electrical dissipation in darkness. This is not the case with photoconductive devices.

The device according to the invention makes it possible to obtain detectors with large areas and enables operation in a wide range of wavelengths.

SUMMARY OF THE INVENTION

The invention therefore concerns a radiation detector comprising:
at least one element made of superconductive material, illuminated by the radiation to be detected;
an electrical source connected to the terminals of the element made of superconductive material;
a device to measure the resistance of the element made of superconductive material, connected to this element.

Among different embodiments, the invention more particularly concerns a detector wherein:
the electrical source is a constant current source;
the differential inputs of a differential amplifier are connected to the terminals of the superconductive element, the amplifier giving a signal representing the value of the resistance of the superconductive element.

The invention also concerns a detector comprising a series of series-connected superconductive elements, a differential amplifier being associated with each superconductive element, and comprising a charge-coupled device, an output of each amplifier being connected to a stage of the charge-coupled device, enabling the signals given by the different amplifiers to be added up.

BRIEF DESCRIPTION OF THE DRAWINGS

The different objects and features of the invention will appear more clearly in the following description, made by way of an example, with reference to the appended figures, wherein.

DETAILED DESCRIPTION OF THE INVENTION

Figure 3:
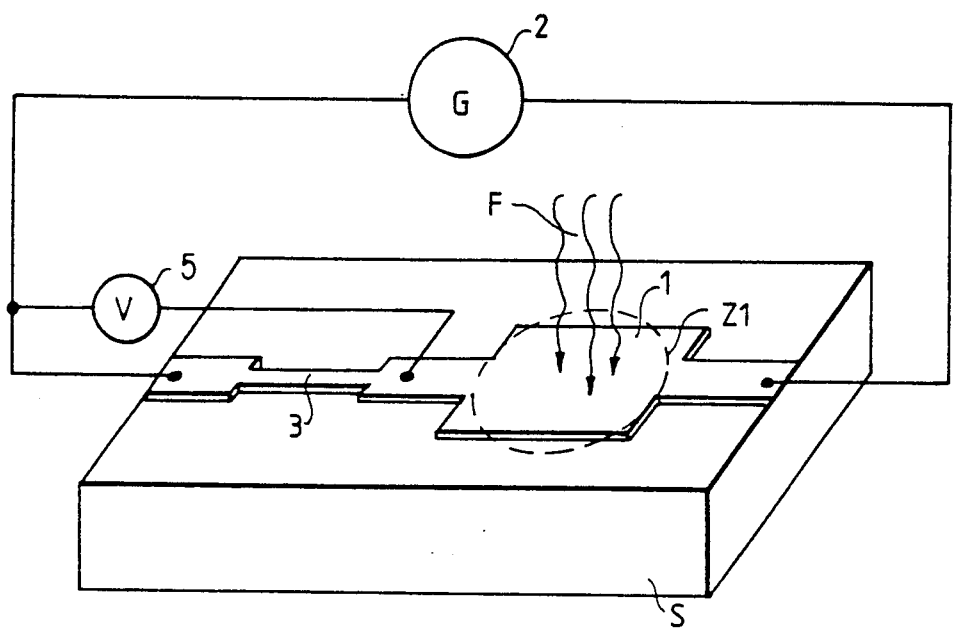
FIG. 3 shows a simplified, exemplary embodiment of an elementary radiation detector according to the invention.

Referring to FIG. 3, we shall describe a simplified exemplary embodiment of a radiation detector according to the invention.

This detector has an element 1, made of a superconductive material, on a substrate S. An electrical generator 2 is connected to this element 1. Means constituted by a resistor 3 of constant value and a voltage measuring device 5 are coupled to the element 1 to measure the resistance of the element 1. According to the example of FIG. 3, the generator 2 is a constant voltage source. The resistor 3 is made in the form of a resistive layer, series-connected with the element 1. This resistive layer may be made of the same superconductive material as the element 1, but then (owing to its shrinkage), it has a current density greater than the critical value. The voltage measuring device is connected to the terminals of the resistor 3.

Figure 1:
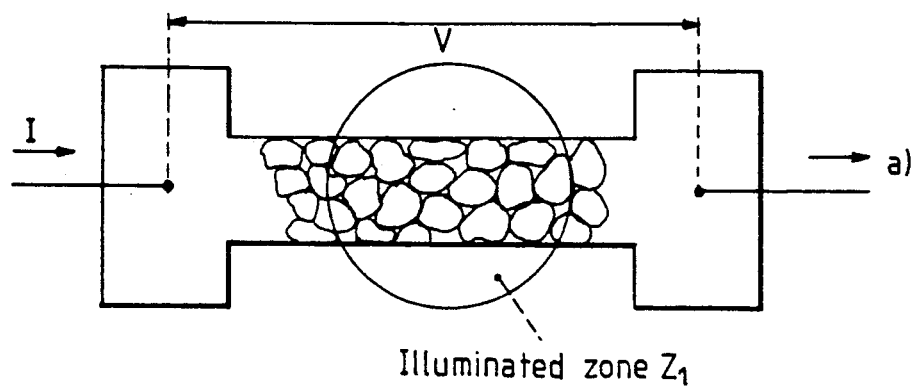
FIG. 1 shows a superconductive element enabling the previously described phenomena to be illustrated.
Figure 2:
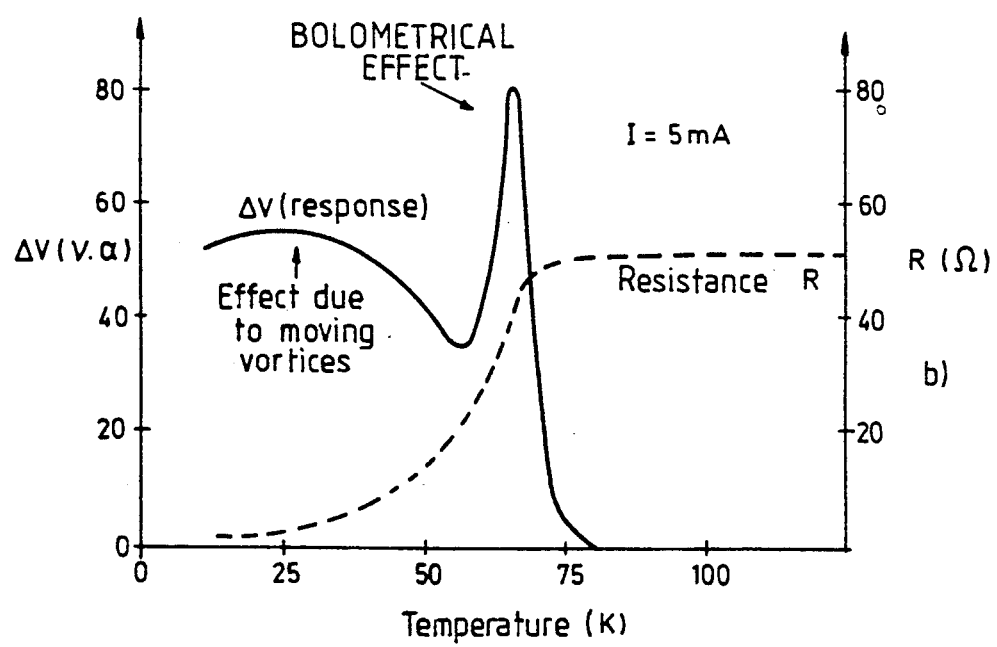
FIG. 2 shows previously described response curves.

The element 1 is illuminated by a beam of radiation F which projects an illumination spot on a zone $Z_1$ shown by a circle in FIG. 1. As described further above, this illumination induces an effect of photoresistivity in the superconductive element 1. The resistance of this element varies. The current delivered by the constant voltage source 2 varies. The voltage measuring device 5 measures the voltage at the terminals of the constant resistor 3 and, hence, the current circulating in the element 1 and, consequently, indicates a value with the form:

$$\frac{V_o}{R3 + R_p}$$

where: $V_o$ is the voltage of the voltage source;

R3 is the value of the resistor 3;

$R_p$ is the resistance of the illuminated element, the value of which expresses the intensity of the radiation received by the superconductive element 1.

This resistance value $R_p$ thus expresses the intensity of the radiation received in the zone $Z_1$.

Figure 4:
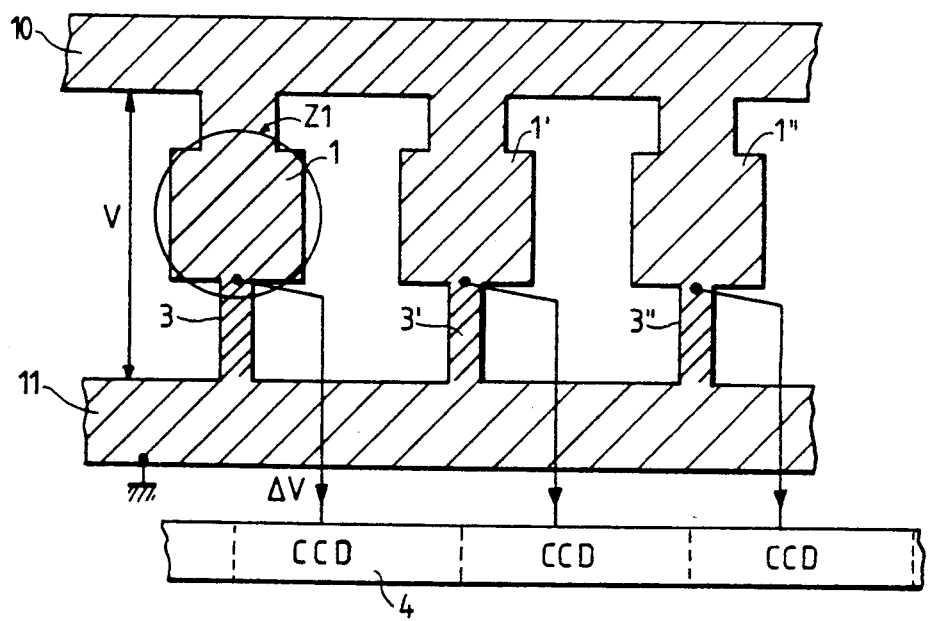
FIG. 4 shows an exemplary embodiment of a set of detectors according to the invention, supplied at constant voltage.

FIG. 4 represents an exemplary embodiment comprising a series of detectors using the device of FIG. 3.

A series of elements 1, 1', 1" made of superconductive material are formed on a substrate. Resistors 3, 3', 3" are serially associated with each superconductive element.

The elements 1, 1', 1" and the resistors 3, 3', 3" are connected in parallel by conductors 10 and 11 to the terminals of a constant voltage source (not shown).

The elements 1, 1', 1", the resistors 3, 3', 3" and the conductors 10, 11 are made in the form of layers on a substrate.

Since the elements 1, 1', 1" are made of a superconductive material, the conductors 10 and 11 are preferably also made of a superconductive material. The resistors 3, 3', 3" are made of either a non-superconductive (normally conductive) metallic material or of a superconductive material with a current density that is greater than the critical current density.

Voltage measuring devices are associated with each resistor 3, 3', 3" and they each measure the intensity of the radiation received in a zone $Z_1$ of the detector. In providing for several lines of detectors, and even for several hundreds of lines, a matrix of detectors is obtained, such as the one shown in FIG. 7 which enables an image to be received, each superconductive element enabling an image element (or picture element) to be detected.

According to the embodiment of FIG. 4, an array of a charge-coupled device 4 is associated with each row of superconductive elements (1, 1', 1") and resistors (3, 3', 3"). To each resistor 3, 3', 3", there is coupled a respective stage CCD, CCD', CCD" of the charge-coupled device 4.

Using means that are not shown, an image element to be detected sweeps the row of superconductive elements 1, 1', 1", i.e. it is transmitted successively to these elements. Each of the different stages CCD, CCD', CCD" of the charge-coupled device 4 thus detects this image element. The charge-coupled device integrates the values recorded by the different stages CCD to CCD" and gives a detection value for each image element.

A device such as this can be easily made by seeing to it that the superconductive elements 1, 1', 1" and the resistors 3, 3', 3" are made monolithically on the surface of a charge-coupled device, the charge-coupled device taking the place of the substrate of FIG. 3 and the elements made of superconductive material being deposited directly on a silicon substrate.

A device such as this can also work statically. In this case, each superconductive element enables the detection of an image element at each instant. To each resistor associated with a superconductive element, there is coupled a voltage measuring device (not shown) instead of a stage of a charge-coupled device. At each instant, each voltage measuring device gives an indication on the intensity of the radiation received by a superconductive element. At each instant, all the voltage measuring devices detect an image conveyed by the radiation beam received by all the superconductive elements.

Figure 5:
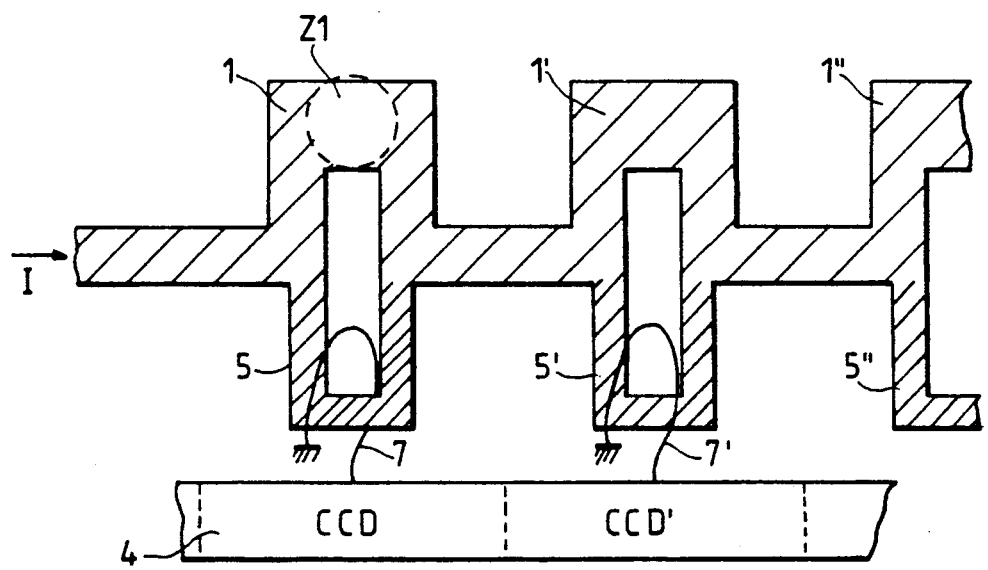
FIG. 5 shows an exemplary embodiment of a set of detectors according to the invention, supplied at constant current.

FIG. 5 shows an exemplary embodiment wherein the electrical generator is a constant current source.

A row of superconductive elements 1, 1', 1" is serially powered by a source (not shown) giving a constant current I. Resistors 5, 5', 5" are connected in parallel to the terminals of each element 1, 1', 1". A device enables the measurement of the intensity of the current in each resistor 5, 5', 5". According to the exemplary embodiment of FIG. 5, there is provided a coupling loop (7, 7') that is associated with each resistor (5, 5') and enables the detection of the intensity of the current in each resistor (5, 5'). Each coupling loop is connected to a respective stage CCD, CCD' of an array of a charge-coupled device 4. Instead of each coupling loop, it is also possible to provide for a differential amplifier, the differential inputs of which are connected to the terminals of a resistor (5, 5', 5") and the output to a stage (CCD, CCD') of the charge-coupled device 4.

Using means that are not shown, an image element sweeps through the different superconductive elements 1, 1', 1". Each time that a radiation spot ($Z_1$) passes over a superconductive element (1), the corresponding stage (CCD) records a detection value corresponding to the intensity of the spot ($Z_1$). After the sweeping of the superconductive elements 1, 1', 1" of one row, the charge-coupled device integrates the different values recorded and gives a value of the intensity of the radiation spot detected. The following image element can then be detected.

As previously noted, a row of superconductive elements and the associated resistors may be made on a charge-coupled device to give a monolithic embodiment. The device of FIG. 5 may also be made in a physical form similar to the structure of FIG. 7.

The device of FIG. 5 can work statically in making provision, in association with each resistor 5, 5', 5'', for a device to measure the current circulating in each resistor. At each instant, a set of superconductive elements thus detects an image conveyed by a beam of radiation illuminating this set of superconductive elements.

Figure 6:
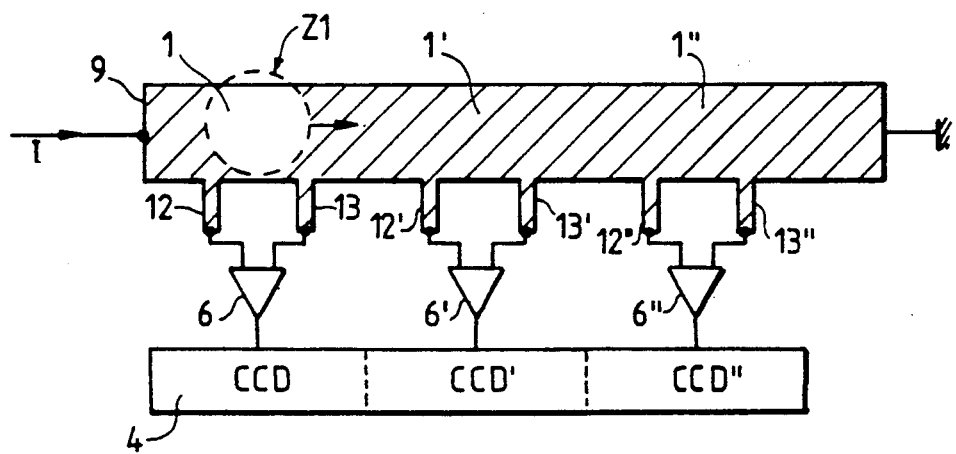
FIG. 6 shows a preferred exemplary embodiment of a detector according to the invention.

FIG. 6 shows a preferred exemplary embodiment of the device of the invention.

This device includes a strip 9 made of a superconductive material. This strip 9 is provided with pairs of contacts 12—13, 12'—13', 12''-13''. That part of the strip 9, included between two contacts of one pair, 12 and 13, for example, demarcates the equivalent of a superconductive element (1 according to the example taken), as designated earlier.

The two differential inputs of a differential amplifier are connected to the contacts of a pair of contacts. We therefore have, in this way, a differential amplifier connected to the contacts 12 and 13.

The output of each differential amplifier (6, 6', 6'') is connected to a stage (CCD, CCD', CCD'') of an array of charge-coupled device.

The strip 9 made of superconductive material is powered by a constant current source (not shown).

When an image element illuminates a superconductive element (1) by a spot ($Z_1$), the resistance of this element varies. The differential amplifier 6 detects this variation and gives a corresponding piece of information to a stage (CCD) of the charge-coupled device.

The spot corresponding to one and the same image element sweeps the strip 9 and successively passes over the superconductive elements 1, 1', 1''. As described earlier, the detection of an image element by the different superconductive elements is integrated by the charge-coupled device which gives a value representing the intensity of the detected spot.

As in the foregoing exemplary embodiments, the device of FIG. 6 can be integrated into an array of a charge-coupled device. In this case, the amplifiers 6, 6', 6'' are themselves also integrated into the charge-coupled device. It is also possible to provide for an embodiment in a matrix form. We then obtain a matrix detector shown in FIG. 8 and including n strips of lines 9.1 to 9.n. Each line strip is designed like the device of FIG. 6 and includes contacts such as 12-13. The set is made on a semiconductive substrate including differential amplifiers and lines of charge-coupled devices, with a line strip corresponding to each charge-coupled device line.

Finally, the device can work statically, without any use of a charge-coupled device, the outputs of the differential amplifiers being then directly connected to devices enabling all the pieces of information given by all the superconductive elements to be recorded.

It is noted that, in the embodiment of FIG. 4, when there is no detection of radiation (darkness), the device dissipates electrical energy. By contrast, in the embodiments of FIGS. 5 and 6, with a constant current source, when there is no radiation, the overall resistance of each row is zero (or almost zero) and the device consumes no energy.

According to an alternative embodiment of the invention, there is a provision, on the superconductive elements (1, 1', 1''), for a filtering layer enabling the transmission, to the superconductive elements, of the radiation only of a selected frequency or of a frequency within a small frequency range.

Figure 9:
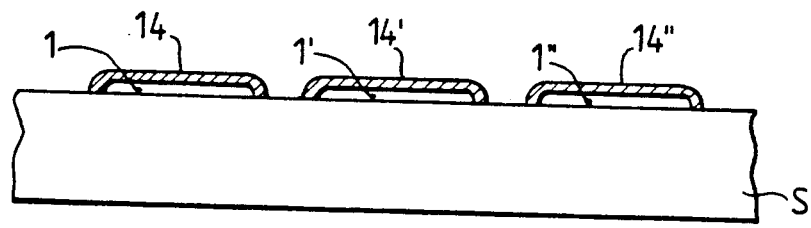
FIG. 9 shows an alternative embodiment of the invention including filtering elements.

According to the invention, there is also a provision, as shown in FIG. 9, on the superconductive elements 1, 1', 1'', for filtering layers 14, 14', 14'' with different natures enabling the superconductive elements to detect radiation of different frequencies.

An arrangement such as this, applied to a row of superconductive elements, as shown in FIGS. 4, 5 or 6, leads to having superconductive elements of one and the same row detecting different frequencies. In this case, a static working of a device such as this will be preferred. As described further above, with each superconductive element there will be associated a resistance measuring device in such a way that, at each instant, all these measuring devices detect an image conveyed by a beam of rays, with different frequencies, received by all the superconductive elements.

Figure 7:
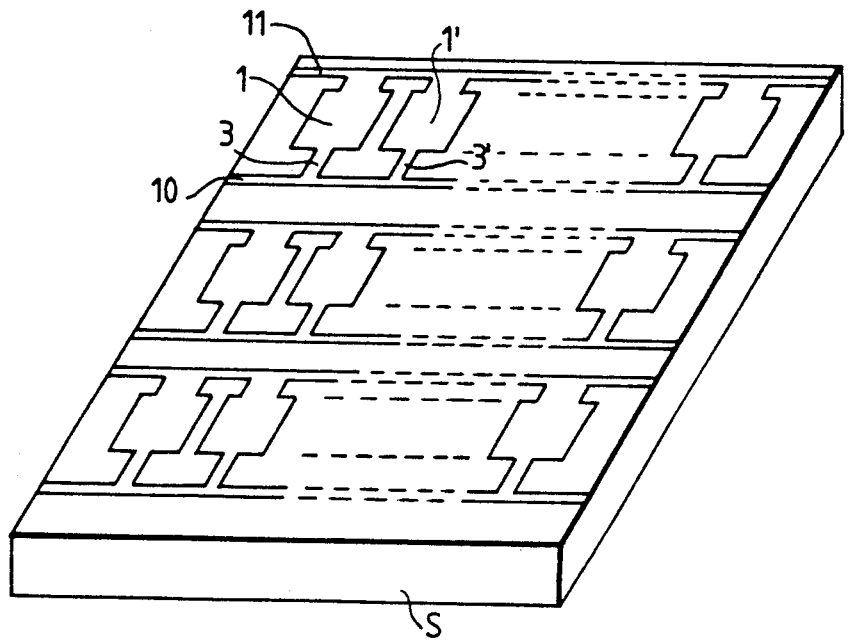
FIG. 7 shows an exemplary matrix embodiment of the detector according to the invention.
Figure 8:
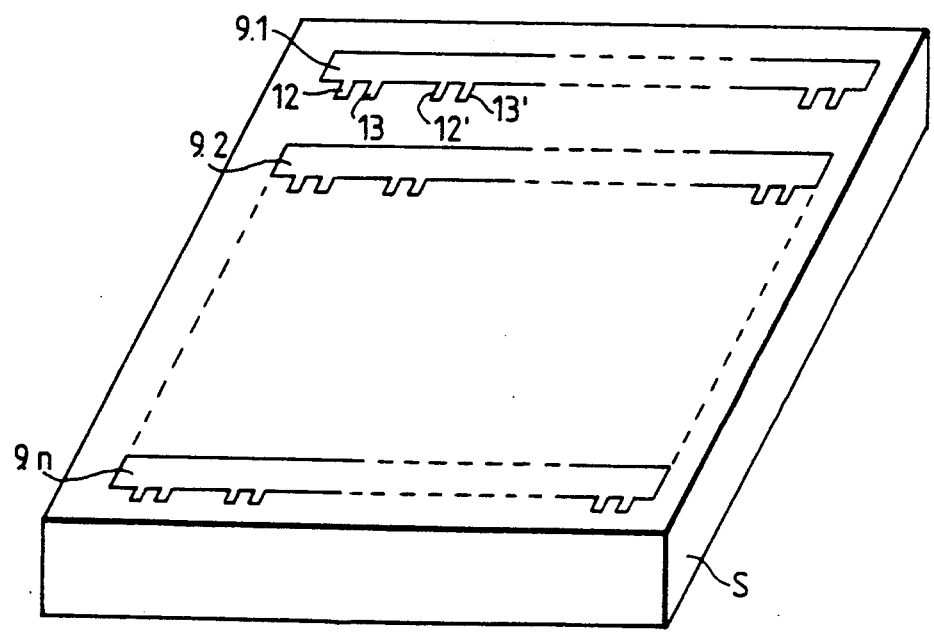
FIG. 8 shows another exemplary matrix embodiment of the detector according to the invention.

In the case of a matrix structure, as shown in FIGS. 7 or 8, there is provision for the superconductive elements of one and the same row to be covered by identical filtering layers in such a way that the superconductive elements of this row are sensitive to one and the same frequency (or to one and the same range of frequency). In this case, it would be possible to cover different rows of superconductive elements with layers of different materials. More practically, there will be provision for optical filtering bands on the rows of superconductive elements.

In a matrix arrangement such as this, consideration is then given to operation with charge-coupled devices associated with the superconductive elements of each row, since the elements of one and the same row detect the same frequencies.

Finally, according to another alternative embodiment, the invention makes a provision, on the devices such as those described previously, for a masking layer with apertures demarcating active zones, on the superconductive elements of these devices, in such a way that this masking zone enables the beam that has to be detected to reach these active zones while it masks the rest of these devices.

This arrangement is particularly valuable for a device of the device described above, in relation with FIGS. 6 and 8, where the superconductive elements are made in the form of a strip 9 and where, in dynamic operation, a radiation spot to be detected sweeps each strip.

Figure 10:
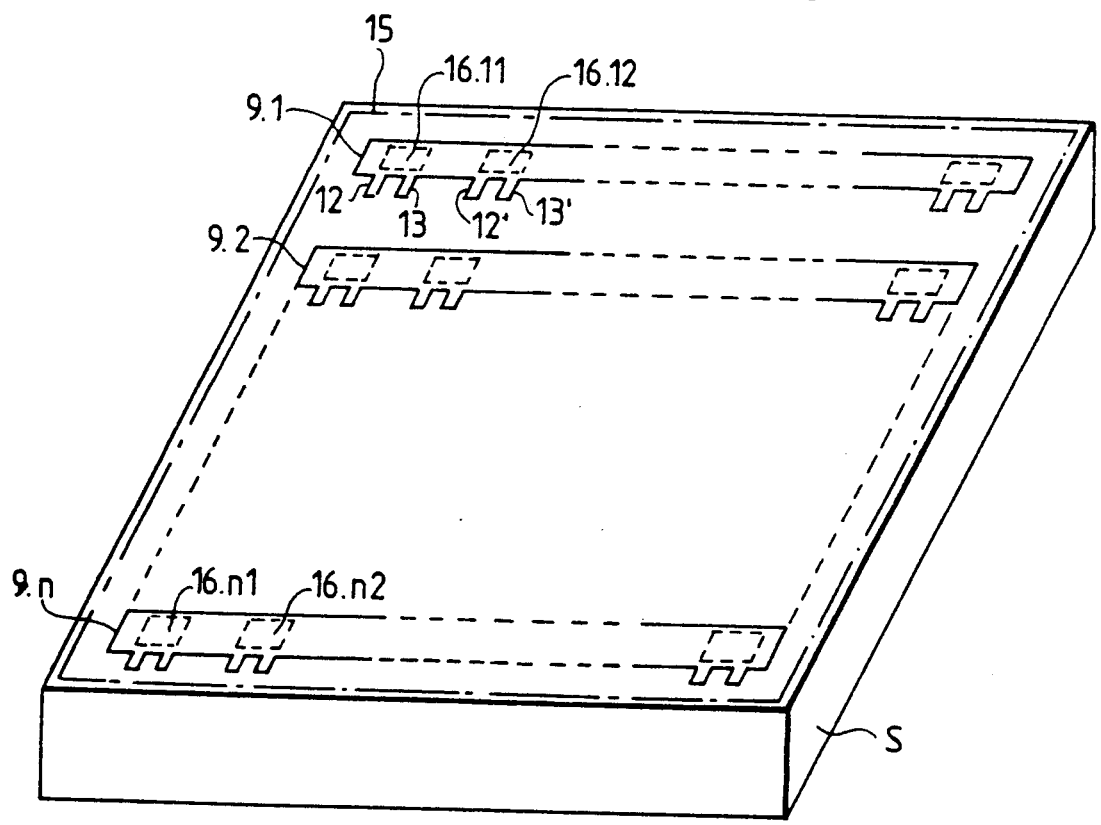
FIG. 10 shows an alternative embodiment of the invention including a masking layer.

FIG. 10 shows a matrix detector of the same type as that of FIG. 8 with a masking layer 15, shown in dots and dashes, having apertures 16.11, 16.12, . . . 16.n1, 16.n2 at the location of the superconductive detection elements.

A masking layer such as this makes it possible to remove the need for precision in the dimension of the radiation spot received by each superconductive element. The sensitive surface of each superconductive element has determined surfaces, and it is enough for the dimensions of each radiation spot to be greater than that of each aperture of the masking layer.

It is also possible to combine a masking layer and filtering layers on the superconductive layers. For example, it is possible to provide for a masking layer having apertures at the location of the superconductive elements and to provide each aperture with a filtering layer. Or else, it is possible to superimpose a masking layer on the filtering layers or vice versa.

In the structures according to the invention, the photoresistivity induced by the incident radiation has major advantages as compared with the photoconductivity of the semiconductors:

- the active part of the superconductive element 1 remains circumscribed to the illuminated zone without any major degree of the spreading observed with the photoconductors. This widening with the photoconductors is attributed to the movement, under the effect of the electrical field, of the carriers created by the radiation during their lifetime. Hence, with the superconductors, it is possible to make the sensitive elements approach each other, in preventing the interactions and integrating the signal on a great number of elementary detectors;
- the length of the lines may be great for it is relatively easy to deposit superconductive layers on large areas and the number of detectors working together per line may be very great;
- the devices according to the invention may work in the infrared and in the dwarf wave modes.

Moreover, in the structures of FIGS. 6 and 7, no power dissipation exists in darkness: this is not the case with the photoconductors.

It is quite clear that the foregoing description has been given purely as a non-restrictive example and that other variants may be contemplated without going beyond the scope of the invention. The numerical examples and the nature of the materials indicated have been given only to illustrate the description.

What is claimed is:

1. A radiation detector comprising:
   at least one element made of superconductive material, illuminated by the radiation to be detected;
   a constant current source connected to the terminals of said at least one element made of superconductive material for applying a continuous current to the superconductive material;
   a device to measure the resistance of said at least one element made of superconductive material, connected to said at least one element, wherein the device for measuring the resistance of said at least one superconductive element includes a resistive element, connected in parallel with said at least one superconductive element, and a measuring device coupled to said resistive element and measuring the magnitude of current flowing in this resistive element.

2. A detector according to claim 1, wherein:
   the electrical source is a constant current source;
   the differential inputs of an differential amplifier are connected to the terminals of said at least one superconductive element, the amplifier giving a signal representing the value of said at least one resistance of the superconductive element.

3. A detector according to claim 2, comprising a row of series connected superconductive elements, a differential amplifier being associated with each superconductive element, and comprising a charge-coupled device, an output of each amplifier being connected to a stage of the charge-coupled device which adds up the signals given by the different differential amplifiers.

4. A detector according to claim 1, wherein said at least one element made of superconductive material is made in the form of a layer on a substrate.

5. A detector according to claim 4, wherein said at least one element made of superconductive material has connections made in layers on the substrate and wherein the resistive elements are also made in layers on the same substrate.

6. A detector according to claim 5, wherein the resistive elements and the connections are made of superconductive material of the same nature as said at least one element made of superconductive material.

7. A detector according to claim 5, wherein the substrate is a semiconductor enabling the association of the signal processing electronic circuits.

8. A detector according to claim 1, comprising at least one row of elements made of superconductive material, series connected and supplied by the generator which is then a constant current source, a resistor being associated in parallel with each element made of superconductive material, with a device measuring the current flowing in each of these resistors.

9. A detector according to claim 8, wherein a charge-coupled device is associated with each set of resistors in such a way that, to each resistor, there is coupled to a stage of the charge-coupled device enabling the detection of the resistance of a superconductive element and, consequently, the detection of the intensity of the radiation received by this superconductive element.

10. A detector according to one of the claims 10 or 9, comprising a plurality of rows of superconductive elements so as to form a matrix structure.

11. A detector according to claim 10, wherein each row of superconductive elements is covered with a layer of a filtering material of a determined nature.

12. A detector according to claim 10, comprising a layer covering the matrix structure and having an aperture at the location of each superconductive element.

13. A detector according to claim 8, wherein the superconductive elements are covered with different layers of filtering material, different superconductive elements being thus sensitive to different frequencies or ranges of frequencies.

14. A detector according to claim 1, wherein said at least one element made of superconductive material is covered with a layer of a filtering material transparent to a radiation frequency or determined range of frequencies.

15. A detector according to claim 1, comprising a layer of a material opaque to radiation, partially covering said at least one superconductive element and having an aperture determining a sensitive detection zone on the superconductive element.

16. A radiation detector comprising:
   at least one element made of superconductive material, illuminated by the radiation to be detected;
   a constant voltage source connected to the terminals of said at least one element made of superconductive material for applying a constant voltage to the superconductive material;
   a device to measure the resistance of said at least one element made of superconductive material, connected to said at least one element, wherein the device for measuring the resistance of sad at least one superconductive element includes a resistive element, series connected with said at least one superconductive element, and a voltage measuring device connected to this resistive element and measuring the magnitude of voltage at the terminals of the resistive element.

* * * * *